(12) United States Patent
Fonseca et al.

(10) Patent No.: US 9,786,523 B2
(45) Date of Patent: Oct. 10, 2017

(54) METHOD AND APPARATUS FOR SUBSTRATE RINSING AND DRYING

(71) Applicant: TOKYO ELECTRON LIMITED, Tokyo (JP)

(72) Inventors: Carlos A Fonseca, Austin, TX (US); Michael A Carcasi, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 36 days.

(21) Appl. No.: 14/211,303

(22) Filed: Mar. 14, 2014

(65) Prior Publication Data

US 2014/0261569 A1    Sep. 18, 2014

Related U.S. Application Data

(60) Provisional application No. 61/783,060, filed on Mar. 14, 2013.

(51) Int. Cl.
| | |
|---|---|
| *B08B 3/00* | (2006.01) |
| *H01L 21/67* | (2006.01) |
| *B08B 3/02* | (2006.01) |
| *H01L 21/02* | (2006.01) |
| *B08B 5/02* | (2006.01) |

(Continued)

(52) U.S. Cl.
CPC .. *H01L 21/67051* (2013.01); *H01L 21/67028* (2013.01); *B08B 3/00* (2013.01); *B08B 3/02* (2013.01); *B08B 3/024* (2013.01); *B08B 3/04* (2013.01); *B08B 3/041* (2013.01); *B08B 5/00* (2013.01); *B08B 5/02* (2013.01);
(Continued)

(58) Field of Classification Search
CPC ......... H01L 23/67034; H01L 21/67051; H01L 21/02052; H01L 21/67034; H01L 21/6704; B08B 3/00; B08B 3/02; B08B 3/024; B08B 3/04; B08B 3/041; B08B 5/00; B08B 5/02
See application file for complete search history.

(56) References Cited

U.S. PATENT DOCUMENTS 7,017,281 B2 * 3/2006 Izumi ................ H01L 21/67034
                                                        134/153
7,997,288 B2    8/2011 Ravkin et al.
(Continued)

FOREIGN PATENT DOCUMENTS

JP    2004095805 A    3/2004
JP    2008124429 A    5/2008
(Continued)

OTHER PUBLICATIONS

International Search Report and Written Opinion issued in counterpart PCT application PCT/US2014/028199, dated Aug. 1, 2014.
(Continued)

*Primary Examiner* — Bibi Carrillo
(74) *Attorney, Agent, or Firm* — Wood Herron & Evans LLP

(57) ABSTRACT

A method and apparatus are disclosed for optimizing a rinsing and drying process in semiconductor manufacturing. The optimization seeks to maximize processing throughput while maintaining low defect counts and high device yields, and utilizes simulation and experimental data to set the optimal process parameters for the rinsing and drying process. Improved methods of rinse liquid and purge gas nozzle movement are also disclosed.

17 Claims, 8 Drawing Sheets

(51) Int. Cl.
  *B08B 3/04*     (2006.01)
  *B08B 5/00*     (2006.01)
(52) U.S. Cl.
  CPC .... *H01L 21/02052* (2013.01); *H01L 21/6704* (2013.01); *H01L 21/67034* (2013.01)

(56) References Cited

U.S. PATENT DOCUMENTS

| | | |
|---|---|---|
| 2002/0035762 A1 | 3/2002 | Okuda et al. |
| 2003/0000034 A1 | 1/2003 | Welsh et al. |
| 2004/0040177 A1 | 3/2004 | Izumi |
| 2004/0079395 A1 | 4/2004 | Kim et al. |
| 2004/0115567 A1 | 6/2004 | Mandal et al. |
| 2005/0211267 A1 | 9/2005 | Kao et al. |
| 2006/0123658 A1 | 6/2006 | Izumi |
| 2007/0223342 A1* | 9/2007 | Orii ............. H01L 21/02052 369/69 |
| 2007/0246079 A1* | 10/2007 | Pham ............ H01L 21/6708 134/26 |
| 2008/0053487 A1* | 3/2008 | Goto ............. H01L 21/02057 134/32 |
| 2008/0092929 A1 | 4/2008 | Yokouchi |
| 2008/0169008 A1 | 7/2008 | Yun et al. |
| 2009/0250079 A1 | 10/2009 | Yoshihara et al. |
| 2010/0141910 A1 | 6/2010 | Van Der Heijden et al. |
| 2010/0154826 A1 | 6/2010 | Printz |
| 2011/0139188 A1 | 6/2011 | Tsai et al. |
| 2011/0229120 A1 | 9/2011 | Takaki et al. |
| 2013/0077065 A1 | 3/2013 | LaFerre et al. |

FOREIGN PATENT DOCUMENTS

| | | |
|---|---|---|
| JP | 2009252855 A | 10/2009 |
| JP | 2013026568 A | 2/2013 |

OTHER PUBLICATIONS

Taiwanese Patent Application No. 103109702, "Notification of Examination Opinion," Taiwanese filing date Mar. 14, 2014, Taiwanese Office Action dated Sep. 3, 2015.

International Patent Application No. PCT/US2014/028199, "International Preliminary Report on Patentability," dated Sep. 15, 2015, International Filing Date Mar. 14, 2014.

Chinese Patent Office, Third Office Action issued in corresponding CN Patent Application No. 201480013368.X dated Jun. 27, 2017, 8 pp., including English translation.

Chinese Patent Office, Second Office Action issued in counterpart Application No. CN201480013368.X dated Jan. 16, 2017, 23 pp., including English translation.

Japan Patent Office, Office Action issued in corresponding Patent Application No. JP2016-502730 dated Sep. 20, 2016, 10 pp., including English translation.

Korean Intellectual Property Office; Office Action issued in corresponding Patent Application No. KR 10-2015-7028221 dated Oct. 30, 2016, 13 pp., including English translation.

English Machine translation of JP 2013026568, 19 pp., Oct. 30, 2016.

\* cited by examiner

METHOD AND APPARATUS FOR SUBSTRATE RINSING AND DRYING

CROSS REFERENCE TO RELATED APPLICATIONS

This application is based on and claims the benefit of and priority to U.S. Provisional Patent Application No. 61/783,060, entitled "METHOD AND APPARATUS FOR SUBSTRATE RINSING AND DRYING", filed on Mar. 14, 2013, the entire contents of which are herein incorporated by reference.

BACKGROUND OF THE INVENTION

Field of the Invention

The present invention relates to a method and apparatus for rinsing and drying of a substrate in semiconductor manufacturing. More particularly, it relates to an improved method for rinsing and drying a substrate, in which defect counts are reduced.

Description of Related Art

A rinsing and drying step is commonly used in many processes in semiconductor manufacturing. In photolithography, this step is used after development of photoresist, to rinse the developer along with developed photoresist, and dry the substrate prior to removal from the processing tool. These steps are also used in other wet processing of substrates, for example, following substrate wet cleaning, or following electrochemical deposition.

In a typical rinse and dry step, the substrate is mounted on a spin chuck and rotated at a set rotation speed. Rinse liquid is dispensed from a nozzle, or plurality of nozzles onto the substrate, the rinse liquid displacing the contaminant that needs to be removed from the substrate. The contaminant may be, for example, a developer solution, cleaning solution, or electrolyte for electrochemical deposition. In a typical process, the rinse solution is introduced at the center of the substrate, initially radially displacing the contaminant from the center of the substrate. The radial displacement of the contaminant along with the rinse liquid is assisted by substrate rotation and by subsequently starting a flow of purge gas, where the flow of purge gas is used to remove the last droplets and traces of contaminant and rinse liquid from the substrate. The rinse liquid dispense nozzle and the purge gas nozzle, or plurality of nozzles, are typically moved across the surface of the substrate in a direction generally outwards from the center of the substrate, towards the substrate edge, leaving a cleaned and dried portion behind. The instantaneous boundary between the still-wet and dry portions of the substrate is defined by a circular rinse liquid meniscus. As the nozzles are moved radially outwards, so does the meniscus. Once the meniscus reaches the edge of the substrate, the entirety of the substrate has been rinsed and dried, and it can be removed from the spin chuck and processing tool for subsequent processing steps.

In semiconductor processing, the desire exists to increase process throughput, i.e. the number of substrates processed in a set amount of time. This desire to increase throughput leads to the use of aggressive processing conditions (i.e., substrate rotation speeds, rinse liquid and purge gas flows and velocities, nozzle movement velocities, etc.) which may lead under certain conditions to the disruption of the meniscus by the purge gas flow, or splashing of still-adhered rinse liquid and contaminant from the wet portion of the substrate to the dry portion of the substrate, both of which can lead to increased device defect counts and reduced processing yield. Under typical processing conditions, the defect count density increases with radius and is highest at the substrate periphery. Improvements are therefore needed to address these high defect counts, particularly at the substrate periphery, while maintaining low processing times and thus high process throughputs.

Specifically, the need exists for a method of optimizing the rinsing and drying process so as to maximize throughput without causing meniscus disruption and splashing, and thus increased defect counts.

SUMMARY OF THE INVENTION

An aspect of the invention includes a method for substrate rinsing and drying, comprising: loading the substrate into a rinse module, the substrate being mounted horizontally on a rotatable spin chuck within the rinse module; starting a first flow of rinse liquid from a dispense nozzle onto the substrate; moving the dispense nozzle horizontally on a dispense nozzle path from the center of the substrate towards the edge of the substrate; starting a second flow of purge gas from a first purge gas nozzle initially located proximate the center of the substrate, to establish a meniscus of the dispensed rinse liquid on the substrate; moving the first purge gas nozzle horizontally towards the edge of the substrate, so as to radially displace the meniscus and dispensed rinse liquid towards the edge of the substrate, wherein moving the first purge gas nozzle comprises maintaining an optimum position of the first purge gas nozzle relative to the dispense nozzle and the meniscus, so as to prevent disruption of the meniscus during movement of the first purge gas nozzle or disruption of the first flow of rinse liquid from the dispense nozzle, or both.

Another aspect of the invention includes further starting a third flow of purge gas from a second purge gas nozzle; moving the second purge gas nozzle horizontally towards the edge of the substrate, wherein moving the second purge gas nozzle comprises maintaining an optimum position of the second purge gas nozzle relative to the dispense nozzle and the meniscus, so as to prevent disruption of the meniscus during movement of the second purge gas nozzle towards the edge of the substrate or disruption of the first flow of rinse liquid from the dispense nozzle, or both.

Further aspects of the invention include various configurations of nozzles and scanning arms that allow moving the nozzles across the substrate and adjusting the height of the nozzle above the substrate. In accordance with embodiments of the invention, multiple nozzles can be mounted on a single scanning arm, or each nozzle can have its own scanning arm. Further in accordance with embodiments of the invention, scanning arms can be actuated in a linear or arcuate manner, and can include means for changing the distance between multiple nozzles mounted on a same scanning arm.

A yet further aspect of the invention includes a method for maintaining optimum position of purge gas nozzles with respect to the rinse liquid dispense nozzle, so as to prevent disruption of the dispensed rinse liquid flow, or meniscus formed on the substrate, or both. Other process parameters of the rinsing and drying process can also be optimized in accordance with further embodiments of the invention.

In a further aspect, the optimization of the rinsing and drying process may include setting conditions to ensure an optimum shear stress is exerted upon the liquid dispensed onto the substrate, and that the air flux over the substrate is set at a value that ensures maximum shear stress without splashing or meniscus disruption.

A further aspect of the invention includes using simulation results for shear stress and air flux, for process control. Furthermore, experimental measurements of the meniscus position, compiled in a library, can be used along with simulation results for process design and control.

BRIEF DESCRIPTION OF THE DRAWINGS

A more complete appreciation of the invention and many of the attendant advantages thereof will become readily apparent with reference to the following detailed description, particularly when considered in conjunction with the accompanying drawings, in which.

DETAILED DESCRIPTION OF EXEMPLARY EMBODIMENTS

Embodiments of the present invention relate to design and control of a process, apparatus, and system for rinsing and drying a substrate, in semiconductor manufacturing.

In the following description, in order to facilitate a thorough understanding of the invention and for purposes of explanation and not limitation, specific details are set forth, such as particular geometries of a lithography, coater/developer, and gap-fill treatment system, and descriptions of various components and processes. However, it should be understood that the invention may be practiced in other embodiments that depart from these specific details.

In the description to follow, the terms radiation-sensitive material and photoresist may be used interchangeably, photoresist being only one of many suitable radiation-sensitive materials for use in photolithography. Similarly, hereinafter the term substrate, which represents the workpiece being processed, may be used interchangeably with terms such as semiconductor wafer, LCD panel, light-emitting diode (LED), photovoltaic (PV) device panel, etc., the processing of all of which falls within the scope of the claimed invention.

Reference throughout this specification to "one embodiment" or "an embodiment" means that a particular feature, structure, material, or characteristic described in connection with the embodiment is included in at least one embodiment of the invention, but does not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments.

Various operations will be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

Figure 8:
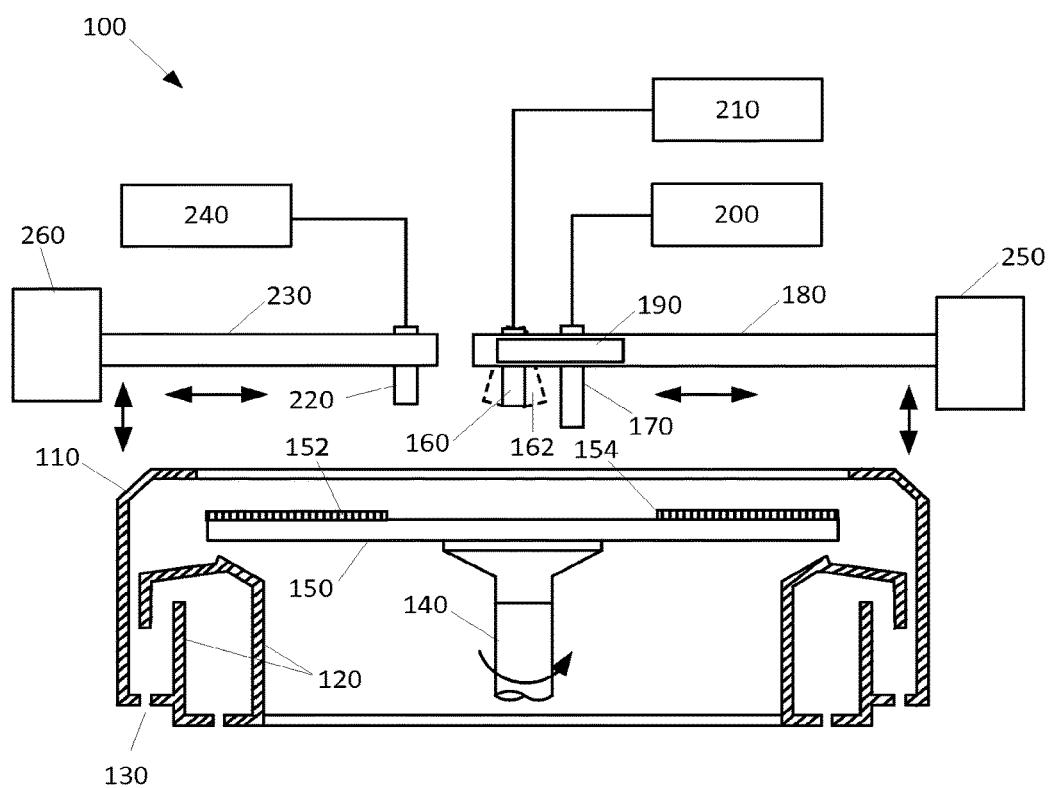
FIG. 8 shows a schematic of a rinse module in accordance with embodiments of the invention.

FIG. 8 shows a schematic of a rinse module 100 in accordance with embodiments of the invention. The rinse module 100 comprises a spin cup 110 equipped with baffles 120 and fluid outlet 130, all configured to facilitate removal of rinse liquid and contaminants that have been spun off from substrate 150 which is attached to rotating spindle 140. Rinse liquid is dispensed via dispense nozzle 170 onto the upper surface of substrate 150. The rinse liquid, typically deionized water, is supplied from rinse liquid reservoir 200. Dispense nozzle 170 is mounted on a scanning arm 180, which can be moved using motion system 250, to scan the dispense nozzle 170 along a path that starts substantially at the center of the substrate 150 towards the edge of the substrate 150. The combination of motion of dispense nozzle 170 and supplying the rinse liquid ensures the creation of a uniform rinse liquid film 152 of dispensed rinse liquid on the substrate 150. A certain amount of rinse liquid is removed from the substrate 150 by centrifugal force, but the process is further assisted by providing one or more purge gas flows that ensure that the last traces of rinse liquid are removed from the substrate.

In an embodiment, a purge gas nozzle 160 is provided to introduce a purge gas, typically dry nitrogen, to the substrate surface, to assist in displacing the rinse liquid and drying the substrate 150. Purge gas nozzle 160 can be mounted onto scanning arm 180, together with the dispense nozzle 170, and is supplied with purge gas from purge gas source 210. With the purge gas nozzle 160 initially aligned substantially at the center of substrate 150, the purge gas flow impinging on the dispensed rinse liquid film 152 causes the initial creation of a dried portion of the substrate 150, surrounded by a still-wet portion covered with rinse liquid film 152. The two portions are separated by a substantially circular meniscus 154 formed at the inner edge of the dispensed rinse liquid film 152. The simultaneous movement of both the dispense nozzle 170 and the purge gas nozzle 160 towards the edge of the substrate 150 causes the purge gas to dry a progressively larger portion of the substrate 150, enlarging thus the meniscus 154, until the meniscus 154 reaches the edge of substrate 150, at which point the substrate has been completely dried and is ready for transfer to subsequent processing steps.

In this simplest example of operation of rinse module 100, the driving force for the rinse liquid film 152 is provided by both the centrifugal force exerted on the rinse liquid film 152 by substrate rotation, and by the shear stress exerted on the rinse liquid film 152 by the flow of purge gas, which flow follows a typical stagnation point flow pattern, i.e., downwards from purge gas nozzle 160 to the substrate 150, and then turning radially outwards in all directions, with the purge gas flow velocity component parallel to the substrate 150 causing a shear stress, also known as aerodynamic drag, on the rinse liquid film 152, to push it outwards and over the substrate edge. Counteracting the centrifugal and shear stress are forces of viscous drag as the rinse liquid film 152 slides across the substrate, and the surface tension forces resulting from the configuration of the meniscus 154 and wetting angles formed by the rinse liquid film 152 against the surface of substrate 150 in the presence of the purge gas and/or ambient air.

From the foregoing discussion it is immediately apparent that the relative alignment of the purge gas nozzle 160 with respect to the instantaneous position of the meniscus 154 is of utmost importance if the process is to proceed at a maximum possible rate, thus maximizing throughput, yet keeping defect counts low. A typical defect scenario occurs if the purge gas nozzle 160 "jumps" over the meniscus 154, causing splashing back of rinse liquid droplets onto the already dried portion of the substrate 150, thus increasing defect count. Other causes may include too small a height of the purge gas nozzle or too large a purge gas flow, both of which can also lead to disruption of meniscus 154 without the purge gas nozzle 160 necessarily "jumping" ahead of the meniscus 154. In practice, the defect counts tend to cluster in the peripheral portions of the substrate, which indicates that the largest challenge is maintaining a stable meniscus 154 when its circumference is large and the purge gas stagnation flow patterns emanating from one or multiple purge gas nozzles are unable to maintain a sufficient and relatively uniform shear stress along the entire circumference of meniscus 154.

The inventors have discovered that the solution to the problem of maximizing throughput while keeping defect counts low is amenable to the use of insights provided by computer simulation and targeted experiments, the results of which can yield useful data for both system design, e.g. nozzle selection, and for in-line process control, e.g. to actively control the positions of one or more purge gas nozzles, to prevent disruption of the meniscus and/or splashing of droplets back into the dried portion of substrate 150. Other conditions that can be also accounted for and prevented include avoidance of disruption of the rinse liquid flow from dispense nozzle 170 by a nearby purge gas flow from purge gas nozzle 160, when the separation distance between the two is small.

Computer codes such as FLUENT, provided by ANSYS Inc., of Southpointe, 275 Technology Dr., Canonsburg Pa. 15317, or COMSOL Multiphysics, provided by COMSOL Inc., of 1 New England Executive Park, Burlington Mass. 01803 are nowadays capable of handling the multi-physics multi-phase simulations involved in modeling the movement of rinse liquid film 152 and meniscus 154 across substrate 150 under the influence of centrifugal, shear, viscous, and surface tension forces.

Figure 1:
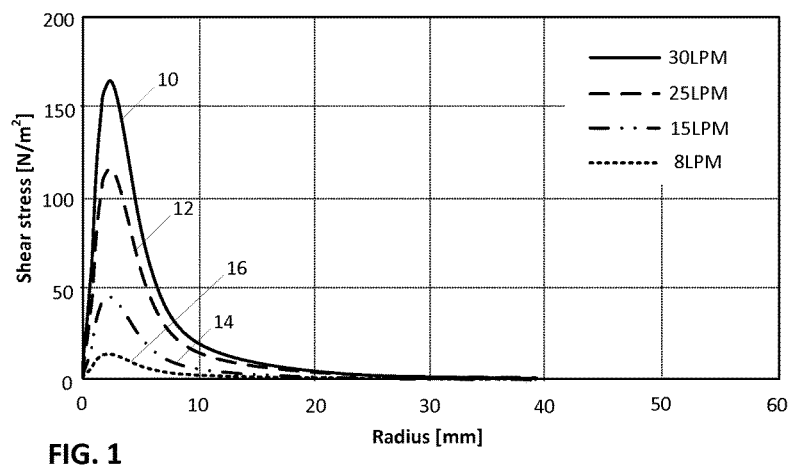
FIG. 1 shows the dependence of the simulated shear stress on the distance from a purge gas nozzle.

FIG. 1 shows an exemplary graph of simulated shear stress vs. radial location, distance from the centerline of the purge gas jet for four different purge gas flows ranging from 8 to 30 liters per minute (LPM), for a fixed purge gas nozzle diameter and fixed height of the nozzle above the substrate. In the close vicinity of the jet centerline but not at the centerline itself, the shear stress curves 10, 12, 14, 16 all reach a peak value, which depends on the purge gas flow. The magnitude of the peak is highest for the largest purge gas flow. Thereafter, as the purge gas flow spreads radially outwards from the purge gas jet centerline, the shear stress drops off rapidly. Simulations of this kind can be used to determine the required purge gas flow rate to achieve a certain required magnitude of shear stress.

Figure 2:
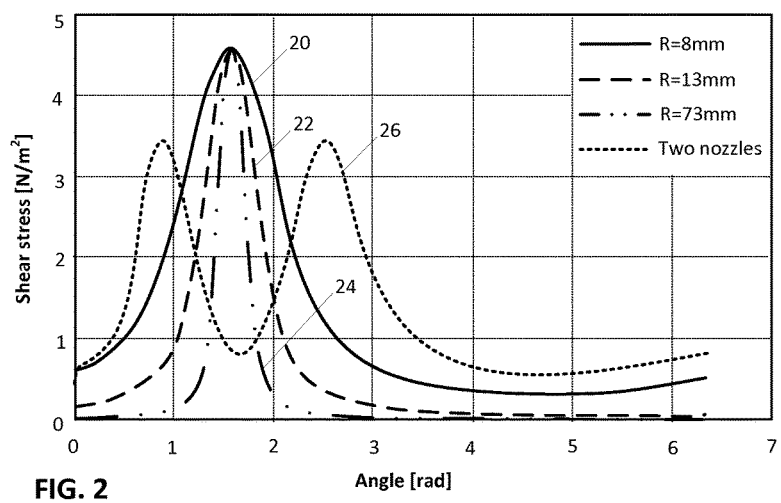
FIG. 2 shows the dependence of the simulated shear stress on azimuthal angular location and substrate radial position.

FIG. 2 shows another exemplary graph of simulated shear stress along the circumference of a rinse liquid meniscus, where the circumferential coordinate is expressed in terms of angle. The instantaneous radial location of the meniscus was varied, and plots 20, 22, 24 for three radii are shown, each at a progressively larger meniscus instantaneous radius. What can be seen is that when the meniscus radius is small, the peak of shear stress imposed on the meniscus and the rinse liquid film is spread out over a relatively large angle, portion of the circumference of the meniscus. As the radius is increased, the peak becomes sharper, i.e. it affects a progressively smaller portion of the meniscus circumference. At some very large radii, the peak may become so sharp as to disrupt the meniscus, so the inventors have explored using multiple purge gas nozzles and flows to "spread" the shear stress along a larger portion of the meniscus, even at large radii. An exemplary plot 26 of shear stress in this scenario is indicated with a dotted line in FIG. 2. The spacing between the peaks is determined by the spacing of the purge gas nozzles, and more generally their location with respect to the meniscus, and not just their azimuthal angular location along the circumference of the meniscus. Simulations of this kind can be used along with simulations of FIG. 1 to determine e.g. the need for transition to multiple purge gas flows in order to maintain as uniform a shear stress acting on the rinse liquid film, as possible.

In similar fashion, simulations can be used to determine dependence of shear stress and other variables on e.g., nozzle height above the substrate 150, or nozzle diameter.

Figure 3:
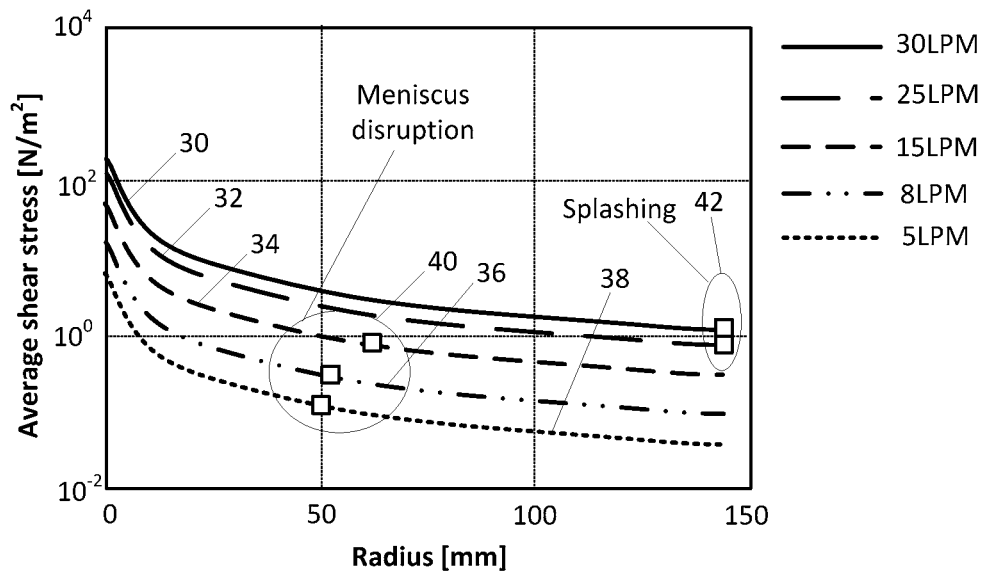
FIG. 3 shows the dependence of simulated average shear stress on radius and purge gas flow, with experimentally determined conditions where disruption of the meniscus and splashing occur.

The simulation results can now be combined with experimental data on conditions under which meniscus disruptions occur to map out the parameter space inside which the rinsing and drying process can safely operate without undue increase of defect counts. For example, FIG. 3 shows an average shear stress (i.e., averaged circumferentially) for a centrally injected purge gas flow, for varying purge gas flow rates, and for varying instantaneous locations, radii of the meniscus. Plotted over the simulated shear stress curves 30, 32, 34, 36, and 38 are radii at which meniscus disruption occurs. At this time, simulations are unable to accurately predict the exact meniscus location, so experimental determination of meniscus location, and particularly the radii at which disruption occurs have to be determined experimentally, for example by conducting experiments over a range of conditions and studying acquired video camera footage of the experiments to correlate disruption events with instantaneous conditions. The region 40 in FIG. 3 indicates the point at which a single centrally-located purge gas flow is unable to maintain a stable meniscus, and additional purge gas flows need to be introduced. Furthermore, region 42 indicates locations at which splashing occurs of rinse liquid droplets from the rinse liquid film back onto the dried portion of substrate 150. With both these failure modes mapped into the shear stress plot, it can be seen that a safe value of shear stress for the conditions used in this example is about 1 N/m². Increasing the shear stress beyond this point has little benefit because of increased defects.

Figure 4:
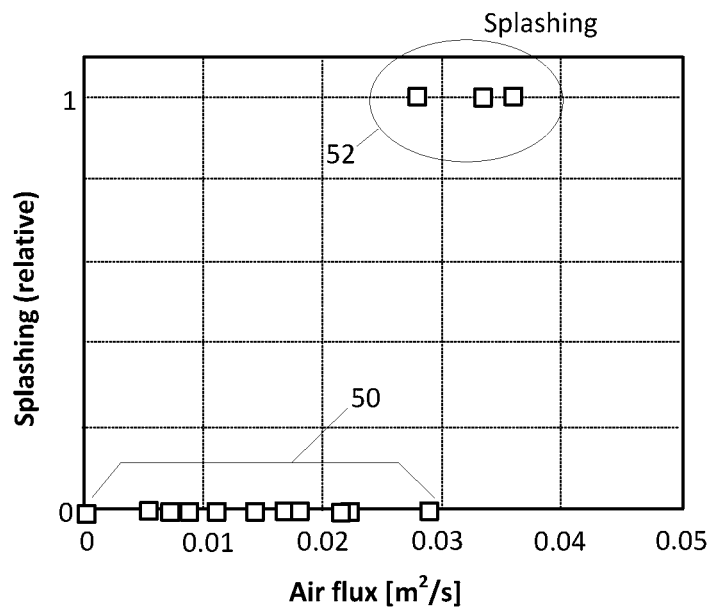
FIG. 4 shows an air flux graph with experimentally determined conditions where splashing does and does not occur.

The inventors have discovered that besides the shear stress, another quantity plays a key role in determining the stability of the meniscus. FIG. 4 shows a plot of simulated air flux caused by the component of purge gas velocity parallel to the substrate 150. The plot shows also relative counts of defects caused by splashing vs. the air flux, determined experimentally in a manner similar to that employed in generating data for FIG. 3. What can be seen is that the plot shows two distinct regions, 50 and 52, respectively. In region 50, no splashing events are seen for relatively low values of air flux. When the air flux is increased above approximately 0.028 m$^2$/s, there is a sudden increase of the number of defects caused by splashing droplets of rinse liquid. Therefore, the plot of FIG. 4 is convenient for determining a second criteria that the rinsing and drying process conditions need to satisfy in order to keep the defect count low.

These aforementioned simulation and experimental results were found useful, by the inventors, for a number of different purposes including but not limited to: (1) designing the rinsing module hardware, e.g., nozzles, scanning arms, etc., (2) determining a narrowed space of conditions in which optimum rinsing and drying conditions are located, so as to reduce the number of experiments needed to arrive at an optimum process condition, and (3) the results can be directly used for in-line control of the rinsing and drying process. For example, the simulation and experimental results, such as e.g., meniscus locations determined experimentally for different process conditions, can be stored in look-up tables, or libraries, for fast look-up by an in-line controller that would use the data to maintain a precise location of one or more purge gas nozzles with respect to the instantaneous meniscus, to prevent disruption thereof.

Figure 5A:
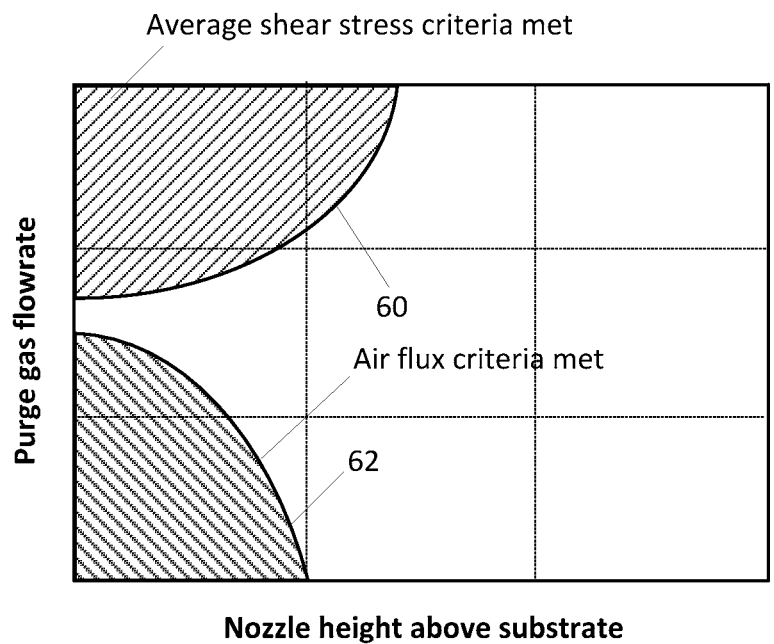
FIG. 5A shows a map of operating conditions for a rinse module in which conditions satisfying both average shear stress criteria and air flux criteria cannot be found.
Figure 5B:
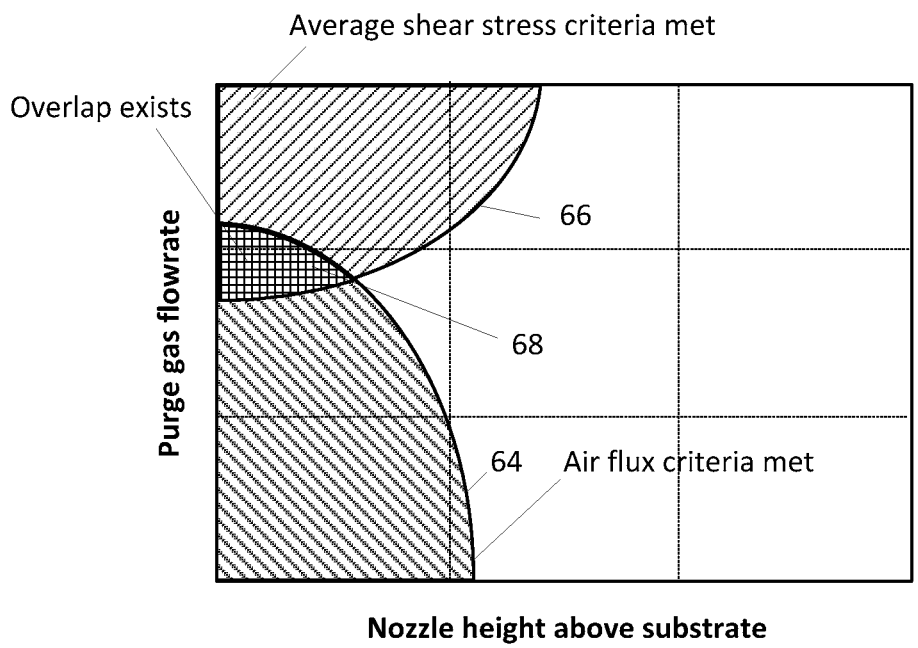
FIG. 5B shows a map of operating conditions for a rinse module in which conditions satisfying both average shear stress criteria and air flux criteria exist.

Examples of using the aforementioned simulation and experimental data in designing rinse module hardware are shown in FIGS. 5A and 5B. As was previously stated, the inventors have discovered that both the shear stress and air flux criteria need to be satisfied in order to enable processing at maximum rate while minimizing defects. Depending on the geometry, purge gas nozzle diameter, etc., and other fixed conditions imposed on the hardware design, such an optimum may exist or may not exist. For example, in FIG. 5A is shown an exemplary map of operating conditions for a fixed purge gas nozzle diameter, in which the height of the nozzle above the substrate and the purge gas flow rate are varied. What can be seen is that when the previously-determined criteria of average shear stress less than 1 N/m$^2$, and air flux less than 0.028 m$^2$/s are mapped into the graph, they create two disjoined islands of conditions, 60 and 62, indicating an absence of optimum conditions for the given hardware constraints.

However, for another chosen exemplary nozzle diameter, an optimum set of conditions 68 can be found between the mapped areas satisfying shear stress and air flux criteria, 64 and 66, respectively. Therefore, graphs such as FIGS. 5A and 5B are useful for both designing hardware and for determining a narrower set of processing conditions where the optimum processing conditions are located. The latter allows a significant reduction of time and cost involved in arriving at optimum production processing conditions for a rinsing and drying process.

So far in our description of simulation and experimental results, only single purge gas nozzles were used. It has been shown before, however, that in order to maintain a stable meniscus, particularly at large radii, a plurality of purge gas flows may be needed to maintain the optimum average shear stress and air flux conditions. The inventors have discovered that for conditions typical of rinsing and drying processes, a simple model can be built wherein superposition of results from multiple simulations of single purge gas flows processes is used to arrive at a very good estimate of conditions when multiple purge gas nozzles and purge gas flows are employed. The use of superposition eliminates the need for doing experiments over huge process condition spaces associated with multiple purge gas flow situations. For example, to simulate the plot 26 for two purge gas nozzles, of FIG. 2, inventors have applied superposition of two data sets simulated for a single purge gas nozzle. A similar approach can be taken in the case of air flux, where a simple vector addition of air flux contributions to a total air flux, from multiple individual air flux simulations can be used instead of simulating and storing results for multiple purge gas flow situations. In general, the use of multiple nozzles has a highly beneficial effect on the shear stress condition, and a lesser effect on the air flux condition.

A further aspect of the invention involves the use of fan nozzles for maintaining a meniscus, as opposed to an array of circular nozzles. Fan nozzles have the benefit of spreading the shear stress and air flux over a larger portion of the meniscus circumference, thereby reducing the likelihood of meniscus disruption for otherwise similar process conditions. Fan nozzles comprise a flattened nozzle exit causing the emerging purge gas jet to be elongated in the direction of the circumference of the meniscus.

Yet a further aspect of the aforementioned simulation and experimental processes is the optimization of impingement angle of the purge gas jet against the substrate surface. The change of impingement angle alters the stagnation flow pattern and can favorably alter the process conditions of the rinsing and drying process.

Figure 6:
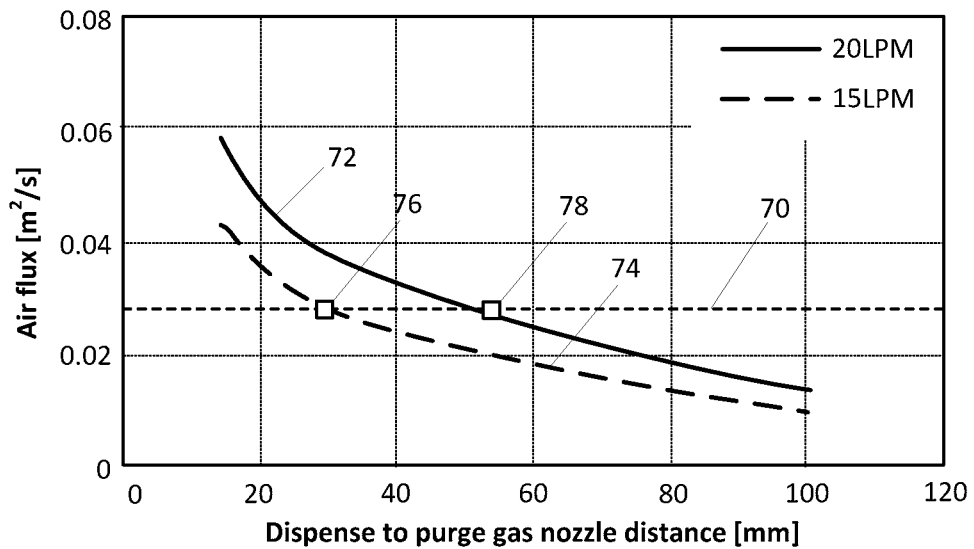
FIG. 6 shows the dependence of air flux on dispense to purge gas nozzle distance and purge gas flow.

Further with respect to hardware and process optimization, FIG. 6 shows a plot of air flux from a single purge gas nozzle plotted against the distance between the dispense nozzle for varying purge gas flows. What can be seen from the plots 72 and 74 is that they can be used to determine a required distance between the dispense nozzle 170 and purge gas nozzle 160 such that a required air flux (line 70) is maintained at the meniscus location. For example, for a purge gas flow rate of 15 liters per minute, the required distance from the dispense nozzle 170 to the purge gas nozzle 160 is in the neighborhood of 30 mm (condition 76). A larger distance of 55 mm (condition 78) can be used with a larger purge gas flow rate of 20 liters per minute. These plots can be used to minimize the purge gas flow consumption while ensuring that the air flux criteria are met.

Figure 7:
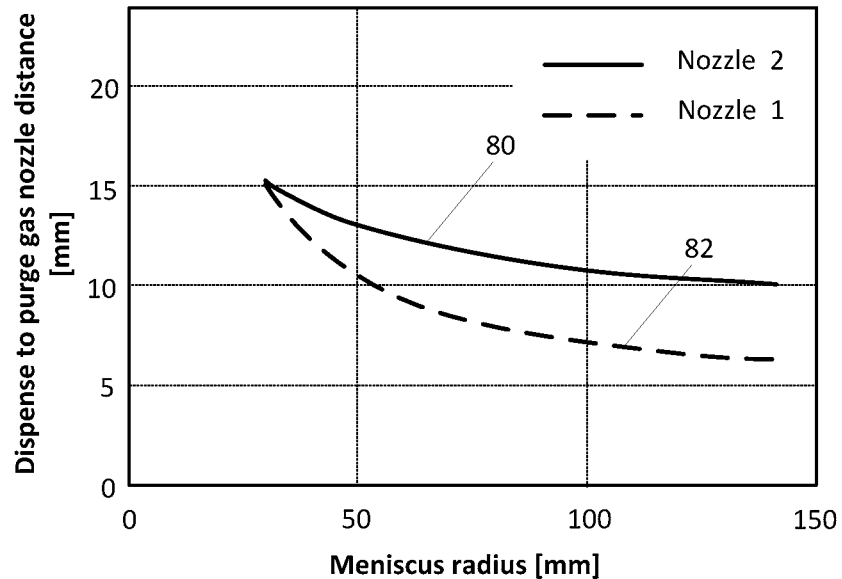
FIG. 7 shows the dependence of the rinse liquid dispense nozzle to purge gas nozzle distance on the instantaneous meniscus radius, for two nozzle configurations.

Lastly, FIG. 7 shows the distance between the dispense nozzle 170 and purge gas nozzle 160 plotted as a function of instantaneous meniscus radius for two purge gas nozzles in a rinse module 100 with two purge gas nozzles, of which nozzle 1 is closer to the dispense nozzle and nozzle 2 is located farther out from the dispense nozzle. The plot is generated such that aforementioned criteria of meniscus stability are satisfied, and clearly shows that for optimum conditions to be maintained, the distances of nozzle 1 and nozzle 2 to the dispense nozzle need to be varied as the nozzles are scanned across the substrate. Therefore, in both single purge gas flow and multiple purge gas flow rinse modules, provision needs to be made to vary these distances during the across-substrate nozzle scanning.

With reference again to FIG. 8, wherein a schematic of a rinse module 100 is shown, the aforementioned addition of a second purge gas nozzle 220 is achieved by adding a second scanning arm 230 to the rinse module 100. The second purge gas nozzle 220 is supplied with purge gas from purge gas source 240. In an alternative embodiment, the same purge gas source can be used to supply purge gas to both nozzles 160 and 220. Furthermore, to enable a variable distance between the dispense nozzle 170 and the purge gas nozzle 160, a motorized mount 190 can be utilized on scanning arm 180 to vary this distance. In addition to varying the distance, motorized mount 190 can also be used to vary the angle of purge gas nozzle 160 with respect to the substrate 150, as indicated by reference 162. A similar arrangement can be made (not shown) for second purge gas nozzle 220, on scanning arm 230, for variation of angle of second purge gas nozzle 220. In addition to scanning nozzles 160, 170, and 220 across the substrate, scanning arms 180 and 230 can be lowered and elevated using motion systems 250 and 260, respectively, to vary the distance from the nozzles to the substrate. With all these provisions made for changing the relative positions and angles of nozzles, plus their heights, the aforementioned methods can be used to maintain optimum process conditions throughout a rinsing and drying process without causing disruption of the meniscus 154, disruption of the flow of rinse liquid from the dispense nozzle 170, and/or splashing. In further embodiments (not shown), separate scanning arms can be used for all three nozzles 160, 170, and 220, for example.

Figure 9A:
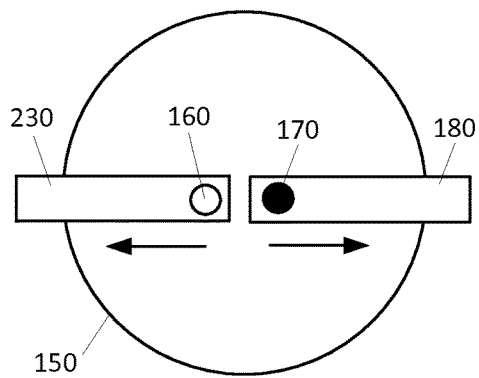
FIGS. 9A-9H show schematics of various configurations of nozzles and scanning arms in accordance with embodiments of the invention.
Figure 9B:
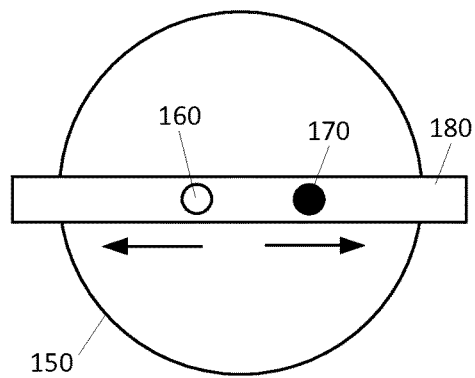
Figure 9C:
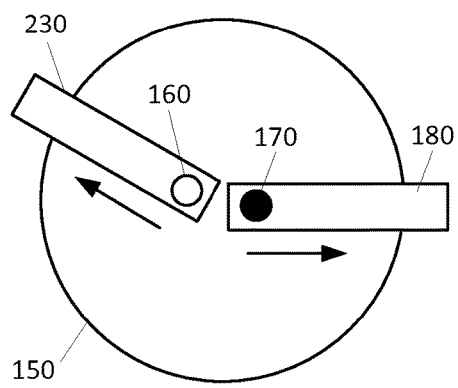
Figure 9D:
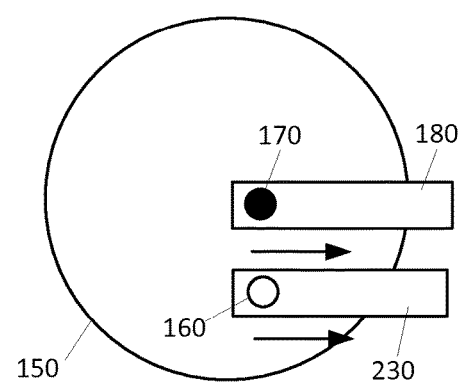
Figure 9E:
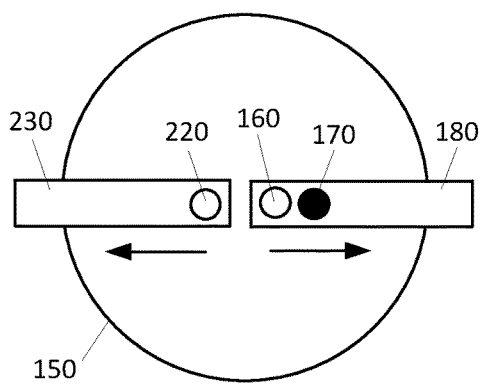
Figure 9F:
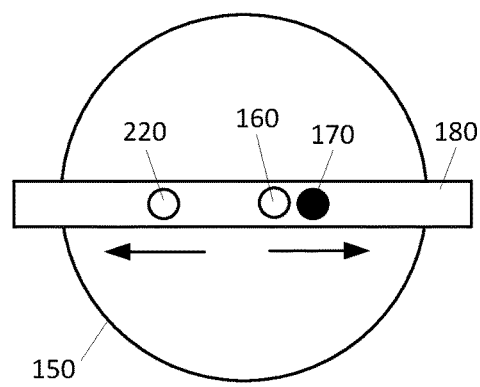
Figure 9G:
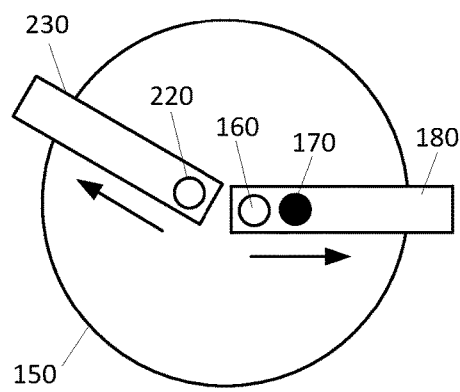
Figure 9H:
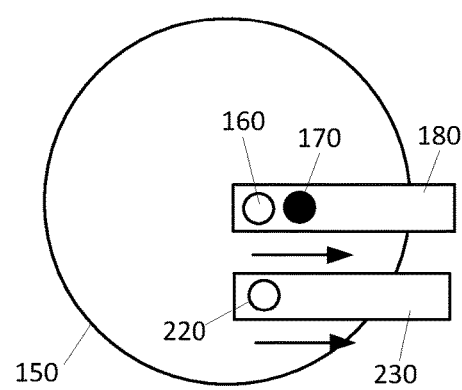

FIGS. 9A-D show various possible scanning arm configurations for a rinse module 100 with a single rinse liquid dispense nozzle 170 (indicated with a dark dot) and a single purge gas nozzle 160 (indicated with a light dot). FIG. 9A shows a configuration where nozzles 160 and 170 are mounted on separate scanning arms 180 and 230 wherein the scanning arms are configured to move the nozzles radially outwards along radially opposing paths. FIG. 9B shows a configuration in which a single scanning arm 180 carries both nozzles 160 and 170 with provision made for independent adjustment of location of both nozzles, which can move in opposing directions or together towards the edge of substrate 150. FIG. 9C shows a configuration wherein the scanning arms 180 and 230 of FIG. 9A are mounted azimuthally displaced at an angle other than 0 degrees and 180 degrees therebetween. Lastly, the configuration in FIG. 9D uses parallel scanning arms 180 and 230 to move nozzles 170 and 160, respectively. In this configuration, the directions of motion are substantially parallel to a radius of the substrate 150, and the path of one scanning arm may coincide with the radius of substrate 150, while the other scanning arm moves along a parallel secant path. The movement along a secant path allows for an effective scanning speed of a nozzle across substrate 150 (in this case purge gas nozzle 160) to be different than the actual scanning speed of the nozzle itself.

Similar to FIGS. 9A-D, FIGS. 9E-H show scanning arm configurations wherein two purge gas nozzles 160 and 220 are provided, similar generally to the configuration shown in FIG. 8. FIG. 9A shows two radially opposing scanning arms 180 and 230 just like shown in FIG. 8. FIG. 9B shows a configuration where all three nozzles are mounted on the same scanning arm with provision made for independent movement thereof. In the embodiments of FIGS. 9A and 9B, the purge gas nozzle 160 can be used to initially establish a meniscus 154 on substrate 150, upon which the purge gas nozzle 160 follows the dispense nozzle 170 and meniscus outwards towards the edge of the substrate 150. At some point during the rinsing and drying process, the second purge gas nozzle 220 can be activated and moved along a radially-opposing path, to maintain a stable meniscus 154 throughout the rinsing and drying process.

It is understood that in all embodiments shown in FIGS. 9A-H, an alternative scanning method (not shown) can be used whereby the scanning arms pivot around their mounting points outside the periphery of substrate 150, rather than being linearly scanned across the substrate 150. Which configuration is used depends on space available in the rinse module 100, the needed scanning speed, optimum processing conditions, etc., and it is possible to combine rotationally- and linearly-scanning scanning arms in the same rinse module 100. Furthermore, the concepts outlined in FIGS. 9A-H can be extended to any number of scanning arms including any number of dispense nozzles and purge gas nozzles. Lastly, in many processing systems, the rinse module serves at the same time as a developing module, so additional scanning arms and nozzles are provided for dispense of developer liquid, in photolithography. In cleaning system, cleaning agents may be dispensed in the same rinse module via additional nozzles and scanning arms.

In all disclosed embodiments it is understood that simulation and experimental results, or both, discussed previously, are used by a controller (not shown) to achieve in-line control of the process. The controller can be preprogrammed to execute a rinsing and drying process in accordance with previously disclosed embodiments of the invention, i.e. using optimum settings determined from simulation and experimental results by ensuring optimum shear stress and air flux conditions, and the controller may use the same simulation and experimental results for in-line control as well, in a feedback or feedforward manner, for process correction on a wafer-to-wafer and lot-to-lot basis, for example.

Figure 10:
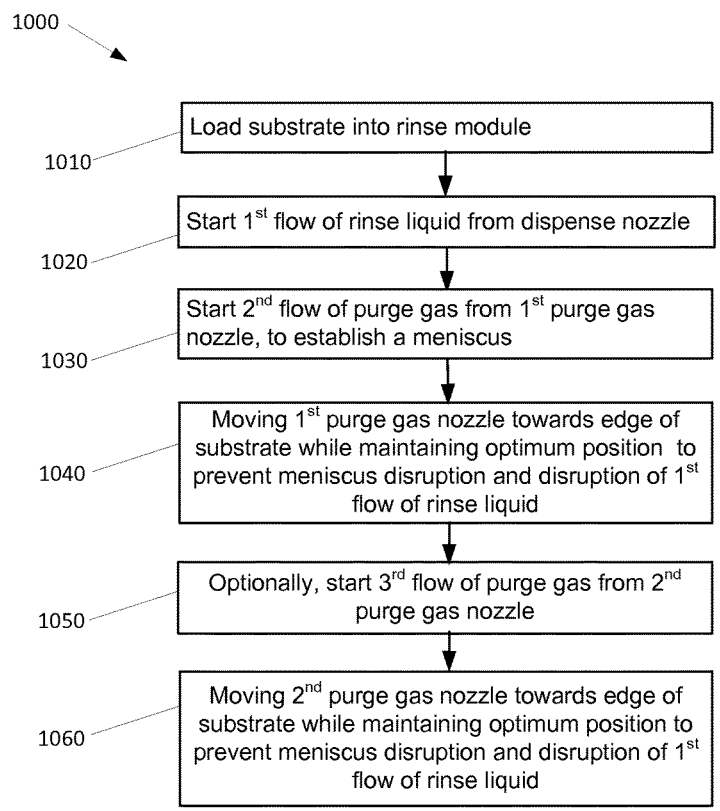
FIG. 10 shows a flowchart of an exemplary process for rinsing and drying a substrate in accordance with embodiments of the invention.

With reference now to FIG. 10, therein is shown a flowchart of an exemplary rinsing and drying process 1000 in accordance with embodiments of the invention. In step 1010, a substrate 150 is loaded into rinse module 100, of FIG. 8, for example. Once rotation of substrate 150 is established, at step 1020 the first flow of rinse liquid is started from dispense nozzle 170 onto the substrate 150, at a location substantially at the center of the substrate 150. Once the rinse liquid film 152 is formed and the dispense nozzle 170 has advanced a predetermined optimum distance from the substrate center, at step 1030, a second flow of purge gas is started from a first purge gas nozzle 160, also at the center of the substrate 150. This second flow of purge gas initially establishes a meniscus 154 and dry portion of the substrate 150. Thereafter, in step 1040, the dispense nozzle 170 and first purge gas nozzle 160 are moved towards the edge of substrate 150 until the meniscus 154 is pushed off the substrate 150. During this movement, the flow rates of rinse liquid and purge gas, nozzle positions and distances therebetween, nozzle heights above the substrate, nozzle angles, etc., are all maintained at values optimized for maximum throughput with minimum defect counts using simulation and experimental data as disclosed before, i.e., ensuring optimum shear stress and air flux conditions. In rinse modules with a single purge gas nozzle, e.g., as described in FIGS. 9A-D, the rinsing and drying process 1000 concludes at this point.

In rinsing modules with a second or more purge gas nozzles, the rinsing and drying process 1000 proceeds with the additional step 1050 of activating a third flow of purge gas from the second purge gas nozzle 220. This step can be started at a predetermined meniscus position, which position is determined using simulation and experimental data in accordance with previously disclosed embodiments of the invention. At step 1060, the second purge gas nozzle 220 is itself moved across substrate 150 towards the substrate edge.

The third flow of purge gas and second purge gas nozzle position are used to assist the already-established second flow of purge gas in maintaining an optimum average shear stress and air flux across the rinse liquid film 152 and meniscus 154, so as to maintain stable rinsing and drying conditions through the end of the rinsing and drying process 1000.

Persons skilled in the relevant art can appreciate that many modifications and variations are possible in light of the above teaching. Persons skilled in the art will recognize various equivalent combinations and substitutions for various components shown in the figures. It is therefore intended that the scope of the invention be limited not by this detailed description, but rather by the claims appended hereto.

What is claimed is:

1. A method for substrate rinsing and drying, comprising:
   loading the substrate into a rinse module, the substrate being mounted horizontally on a rotatable spin chuck within the rinse module;
   starting a first flow of rinse liquid from a dispense nozzle onto the substrate;
   moving the dispense nozzle horizontally on a dispense nozzle path from the center of the substrate towards the edge of the substrate;
   starting a second flow of purge gas from a first purge gas nozzle initially located proximate the center of the substrate, to establish a meniscus of the dispensed rinse liquid on the substrate, wherein the meniscus defines an interface between a wet portion of the substrate radially outward of the meniscus and a dry portion of the substrate radially inward of the meniscus;
   moving the first purge gas nozzle horizontally towards the edge of the substrate, so as to cause radial movement of the meniscus and dispensed rinse liquid towards the edge of the substrate, wherein shear stress exerted on the dispensed rinse liquid on the substrate and an air flux above the substrate caused by velocity of the purge gas flowing parallel to the substrate are established; and
   during moving the first purge gas nozzle, changing a a distance between the first purge gas nozzle and the dispense nozzle as the meniscus increases radially toward the edge of the substrate to maintain both the shear stress and the air flux at values from the center to the edge of the substrate where the radial movement of the meniscus proceeds uniformly at a maximum rate without splashing of the rinse liquid onto the dry portion and without disruption of the uniform radial movement of the meniscus during movement of the first purge gas nozzle or disruption of the first flow of rinse liquid from the dispense nozzle, or both.

2. The method of claim 1, wherein the rinse liquid comprises deionized water.

3. The method of claim 1, wherein the purge gas comprises nitrogen.

4. The method of claim 1, wherein the dispense nozzle and the first purge gas nozzle are both maintained aligned along a radial line extending outwards from the center of the substrate.

5. The method of claim 1, wherein the dispense nozzle and the first purge gas nozzle are both maintained aligned respectively along two diametrally-opposing radial lines extending outwards from the center of the substrate.

6. The method of claim 1, wherein the dispense nozzle and the first purge gas nozzle are azimuthally displaced with respect to one another.

7. The method of claim 1, wherein the dispense nozzle and the first purge gas nozzle are mounted on a first scanning arm.

8. The method of claim 1, wherein the dispense nozzle is mounted on a first scanning arm, and the first purge gas nozzle is mounted on a second scanning arm different than the first scanning arm.

9. The method of claim 1, wherein changing the distance between the first purge gas nozzle further comprises adjusting a height of the first purge gas nozzle above the substrate.

10. The method of claim 1, wherein the changing of the distance between the first purge gas nozzle is determined by computer simulation or experimental measurement data, or both.

11. The method of claim 1, wherein a radius of the meniscus is determined by lookup or interpolation from a library of meniscus positions, wherein the library of meniscus positions was formed by experimentally determining the meniscus position.

12. The method of claim 1, further comprising, during moving the first purge gas nozzle:
    starting a third flow of purge gas from a second purge gas nozzle;
    moving the second purge gas nozzle horizontally towards the edge of the substrate,
    wherein moving the second purge gas nozzle assists in-maintaining both the shear stress and the air flux at values from the center to the edge of the substrate where the radial movement of the meniscus proceeds uniformly at a maximum rate without splashing of the rinse liquid onto the dry portion and without disruption of the uniform radial movement of the meniscus during movement of the second purge gas nozzle towards the edge of the substrate or disruption of the first flow of rinse liquid from the dispense nozzle, or both.

13. The method of claim 7, wherein the first scanning arm changes the distance between the first purge gas nozzle and the dispense nozzle.

14. The method of claim 12, wherein the first and second purge gas nozzles are both maintained aligned respectively along two diametrally-opposing radial lines extending outwards from the center of the substrate.

15. The method of claim 12, wherein the first and second purge gas nozzles are azimuthally displaced with respect to one another.

16. The method of claim 12, wherein the dispense nozzle and the first purge gas nozzle are mounted on a first scanning arm, and the second purge gas nozzle is mounted on a second scanning arm different than the first scanning arm.

17. The method of claim 12, wherein a position of the second purge gas nozzle relative to the dispense nozzle and the meniscus is determined by computer simulation or experimental measurement data, or both.

* * * * *

UNITED STATES PATENT AND TRADEMARK OFFICE
CERTIFICATE OF CORRECTION

PATENT NO. : 9,786,523 B2
APPLICATION NO. : 14/211303
DATED : October 10, 2017
INVENTOR(S) : Carlos A. Fonseca et al.

It is certified that error appears in the above-identified patent and that said Letters Patent is hereby corrected as shown below:

In the Claims

In Column 11, Lines 39-40, Claim 1, "changing a a distance" should read --changing a distance--.

In Column 12, Line 32, Claim 12, "in-maintaining" should read --in maintaining--.

Signed and Sealed this
Twenty-sixth Day of June, 2018

Andrei Iancu
*Director of the United States Patent and Trademark Office*